United States Patent
Morii (10) Patent No.: US 9,135,919 B2
(45) Date of Patent: Sep. 15, 2015

(54) QUANTIZATION DEVICE AND QUANTIZATION METHOD

(75) Inventor: Toshiyuki Morii, Kanagawa (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 334 days.

(21) Appl. No.: 13/821,577

(22) PCT Filed: Sep. 16, 2011

(86) PCT No.: PCT/JP2011/005244
§ 371 (c)(1),
(2), (4) Date: Mar. 8, 2013

(87) PCT Pub. No.: WO2012/035781
PCT Pub. Date: Mar. 22, 2012

(65) Prior Publication Data
US 2013/0173263 A1    Jul. 4, 2013

(30) Foreign Application Priority Data

Sep. 17, 2010   (JP) .................................. 2010-210116
Oct. 13, 2010   (JP) .................................. 2010-230537

(51) Int. Cl.
*G10L 19/00* (2013.01)
*G10L 19/06* (2013.01)
(Continued)

(52) U.S. Cl.
CPC ................. *G10L 19/00* (2013.01); *G10L 19/06* (2013.01); *H03M 7/3082* (2013.01);
(Continued)

(58) Field of Classification Search
None
See application file for complete search history.

(56) References Cited

U.S. PATENT DOCUMENTS 5,271,089 A * 12/1993 Ozawa .......................... 704/222
5,774,839 A *  6/1998 Shlomot ....................... 704/222
(Continued)

FOREIGN PATENT DOCUMENTS

EP        2557566         2/2013
JP        62-234424       10/1987
(Continued)

OTHER PUBLICATIONS

Extended European Search Report, mailed Sep. 10, 2013, from the European Patent Office (E.P.O.) in the corresponding European Patent Application.

(Continued)

*Primary Examiner* — Chuong A Ngo
*Assistant Examiner* — Edwin S Leland, III
(74) *Attorney, Agent, or Firm* — Greenblum & Bernstein, P.L.C.

(57) ABSTRACT

A quantization device and quantization method are provided that reduce coding distortion with a small degree of calculation and achieve adequate coding performance thereby. A multistage vector quantization unit treats a number of candidates N that are designated prior to operation in the first-stage vector quantization unit, decrements the number of candidates by one beginning with the second-stage vector quantization unit and continuing with each stage thereafter. If the number of candidates is three or less, the multistage vector quantization unit assesses the quantization distortion at each stage, treating the number of candidates at the following stage as a predetermined value P if the quantization distortion is greater than a prescribed threshold, and treating the number of candidates at the following stage as a value Q that is less than the predetermined value P if the quantization distortion is less than or equal to the predetermined threshold.

4 Claims, 5 Drawing Sheets

(51) Int. Cl.
  *H03M 7/30* (2006.01)
  *H04N 19/94* (2014.01)
  *G10L 19/07* (2013.01)

(52) U.S. Cl.
  CPC .............. *H04N 19/94* (2014.11); *G10L 19/07* (2013.01); *G10L 2019/0005* (2013.01); *G10L 2019/0006* (2013.01); *G10L 2019/0013* (2013.01); *G10L 2019/0016* (2013.01)

(56) References Cited

U.S. PATENT DOCUMENTS

| | | | | |
|---|---|---|---|---|
| 5,966,688 | A | * | 10/1999 | Nandkumar et al. ......... 704/222 |
| 6,826,526 | B1 | * | 11/2004 | Norimatsu et al. ........... 704/222 |
| 7,047,184 | B1 | * | 5/2006 | Tasaki et al. ............... 704/200.1 |
| 7,392,179 | B2 | | 6/2008 | Yasunaga et al. |
| 2004/0015346 | A1 | * | 1/2004 | Yasunaga et al. ............. 704/219 |
| 2013/0103407 | A1 | * | 4/2013 | Jeong et al. ................... 704/500 |

FOREIGN PATENT DOCUMENTS

| | | | | | |
|---|---|---|---|---|---|
| JP | 62234432 | A | * | 10/1987 | ............... H04B 9/00 |
| JP | 4-171500 | | | 6/1992 | |
| JP | 04171500 | A | * | 6/1992 | ............... G10L 9/18 |
| JP | 4-328800 | | | 11/1992 | |
| JP | 04328800 | A | * | 11/1992 | ............... G10L 9/14 |
| JP | 10-20898 | | | 1/1998 | |
| JP | 10020898 | A | * | 1/1998 | ............... G10L 9/18 |
| JP | 2000-261321 | | | 9/2000 | |
| JP | 2000261321 | A | * | 9/2000 | ............. H03M 7/30 |
| JP | 2002-229597 | | | 8/2002 | |
| JP | 2002229597 | A | * | 8/2002 | ............. G10L 19/00 |
| JP | 2003-008446 | | | 1/2003 | |
| JP | 2003008446 | A | * | 1/2003 | ............. H03M 7/30 |

OTHER PUBLICATIONS

International Search Report for International Application No. PCT/JP2011/005244, mailed Dec. 13, 2011.

* cited by examiner

FIG. 5

QUANTIZATION DEVICE AND QUANTIZATION METHOD

1. TECHNICAL FIELD

The present invention relates to a quantization apparatus and a quantization method which perform quantization by using tree search.

2. BACKGROUND ART

In mobile communication, compression encoding of digital information including speech and image information is indispensable for effective utilization of transmission bands. In particular, expectations are raised for a speech codec (encoding/decoding) technique, which has been widely used for mobile phones, and demand for better sound quality has been increasing for a conventional high-efficient encoding with a high compression rate. Further, in order for the technique to be used in public, the technique needs to be standardized, and hence research and development of the technique have been actively carried out throughout the world.

In recent years, the standardization of a codec capable of encoding both speech and music is under consideration by ITU-T (International Telecommunication Union Telecommunication Standardization Sector) and MPEG (Moving Picture Experts Group), and a more efficient speech codec having higher quality is required.

Speech encoding has made significant progress thanks to CELP (Code Excited Linear Prediction) which was established 20 years ago and is a fundamental method that skillfully applies vector quantization to speech encoding by modeling a vocal tract system of speech. In the International Standards, the CELP is adopted in a number of standard methods, such as ITU-T standard G.729, G.722.2, ETSI standard AMR, AMR-WB, and 3GPP2 standard VMR-WB.

The main techniques of the CELP are an LPC (Linear Prediction Coding) analysis technique capable of encoding an outline of a speech spectrum at a low bit rate, and a technique of quantizing parameters obtained by the LPC analysis. In particular, methods of LPC analysis called line spectral information quantization have been used in most of the published standards in recent years. Typical methods among these methods of LPC analysis include the LSP (Line Spectral Pair) method and the ISP (Immittance Spectral Pair) method obtained by improving the LSP method. Both methods have good interpolation performance and hence have high affinity with vector quantization (hereinafter referred to as "VQ"). By using these encoding techniques, spectral information can be transmitted at a low bit rate. The performance of the codec based on CELP has been significantly improved by these encoding techniques.

In recent years, in order to meet the requirement for a more efficient speech codec having higher quality, a codec which encodes a wideband signal (16 kbps) and an ultra-wideband signal (32 kbps) is being standardized in ITU-T, MPEG, 3GPP, and the like. In the case where LPC coefficients are used for encoding wideband and ultra-wideband digital signals, sixteenth or higher-order LSP or ISP need to be encoded by using a large number of bits. For this reason, a "split VQ" method has been generally used, in which an encoding target (target vector) is divided into a plurality of regions and each of the plurality of divided regions is vector-quantized. However, in the split VQ method, the statistical correlation between the vector elements cannot be used, and hence the encoding performance is degraded.

In response, a multiple-stage quantization method is often used as a method for obtaining better encoding performance. In the multiple-stage quantization method, the target vector is not divided, but the target vector is continuously quantized so as to gradually reduce quantization errors in a plurality of stages of vector quantization. That is, in the multiple-stage quantization method, a quantization error vector obtained in the preceding stage is quantized in the subsequent stage. When only the vector having the smallest error and obtained in the preceding stage is used, the amount of calculation can be significantly reduced. However, when the multiple-stage quantization is performed by using only the quantization result having the smallest error as a candidate in each stage, the encoding distortion is not sufficiently reduced, which results in degradation of the quantization performance.

For this reason, it has been considered to use tree search processing in which some quantization results having smaller errors are left as candidates in the preceding stage. Thereby, high encoding performance can be obtained with a relatively small amount of calculation. Especially, when a large number of bits are allocated, the number of stages is increased to limit an increase in the amount of calculation. However, sufficient quantization performance cannot be obtained in the multiple-stage quantization of a large number of stages without tree search.

Patent Literature 1 describes a method in which an excitation vector based on CELP is quantized in multiple stages. Further, it is known that, when the number of stages is increased, efficient search can be performed by using tree search. A search method performed using the number of candidates (quantization results with small errors) left in each stage, which is termed as "N," is referred to as "N best search." N best search is also known as an efficient multi-stage search method.

Further, in Patent Literature 2, vector quantization is not used, but an example of search based on the N best search is described.

CITATION LIST

Patent Literature

PTL 1
Japanese Patent Application Laid-Open No. 2003-8446
PTL 2
Japanese Patent Application Laid-Open No. 2000-261321

SUMMARY OF INVENTION

Technical Problem

However, in the above-described multiple-stage vector quantization method using the N best search with N>1, the encoding distortion can be reduced when compared with a quantization method in which the number of candidates is reduced to one (N=1) in each stage but the amount of calculation is increased to N times. On the contrary, when the number N is limited to a small value, the encoding distortion is increased.

As described above, the multiple-stage vector quantization method using a conventional N best search is not designed to reduce the encoding distortion with a smaller amount of calculation, and hence sufficient encoding performance cannot be obtained.

An object of the present invention is to provide a quantization apparatus and a quantization method, each of which can reduce the encoding distortion with a small amount of calculation and can obtain sufficient encoding performance.

Solution to Problem

A quantization apparatus according to an aspect of the present invention performs multiple-stage quantization by using tree search, the quantization apparatus including: a search section that matches each of one or more of encoding targets with a code vector stored in a codebook to select a certain number of candidates including one in order of smaller quantization distortion, the number of candidates being determined in a preceding stage or determined beforehand; a calculation section that calculates a quantization error vector by subtracting the code vector from the target for each of the candidates; and a candidate number determination section that determines a certain number of candidates to be used in a subsequent stage, on the basis of the number of candidates determined in the preceding stage.

A quantization method according to an aspect of the present invention is configured to perform multiple-stage quantization by using tree search, the method including: matching each of one or more encoding targets with a code vector stored in a codebook to select, in a first stage, a certain number of candidates including one in order of smaller quantization distortion, the number of candidates being determined beforehand, and to select, in a second stage and in a stages subsequent to the second stage, a certain number of candidates in order of smaller quantization distortion, the number of candidates being determined in a preceding stage; calculating a quantization error vector by subtracting the code vector from the target for each of the candidates; and determining the number of candidates to be used in the subsequent stage, on the basis of the number of candidates determined in the preceding stage.

Advantageous Effects of Invention

With the present invention, encoding distortion can be reduced with a small amount of calculation, and sufficient coding performance can be obtained.

DESCRIPTION OF EMBODIMENTS

In the following, embodiments according to the present invention will be described in detail with reference to the accompanying drawings.

Embodiment 1

Figure 1:
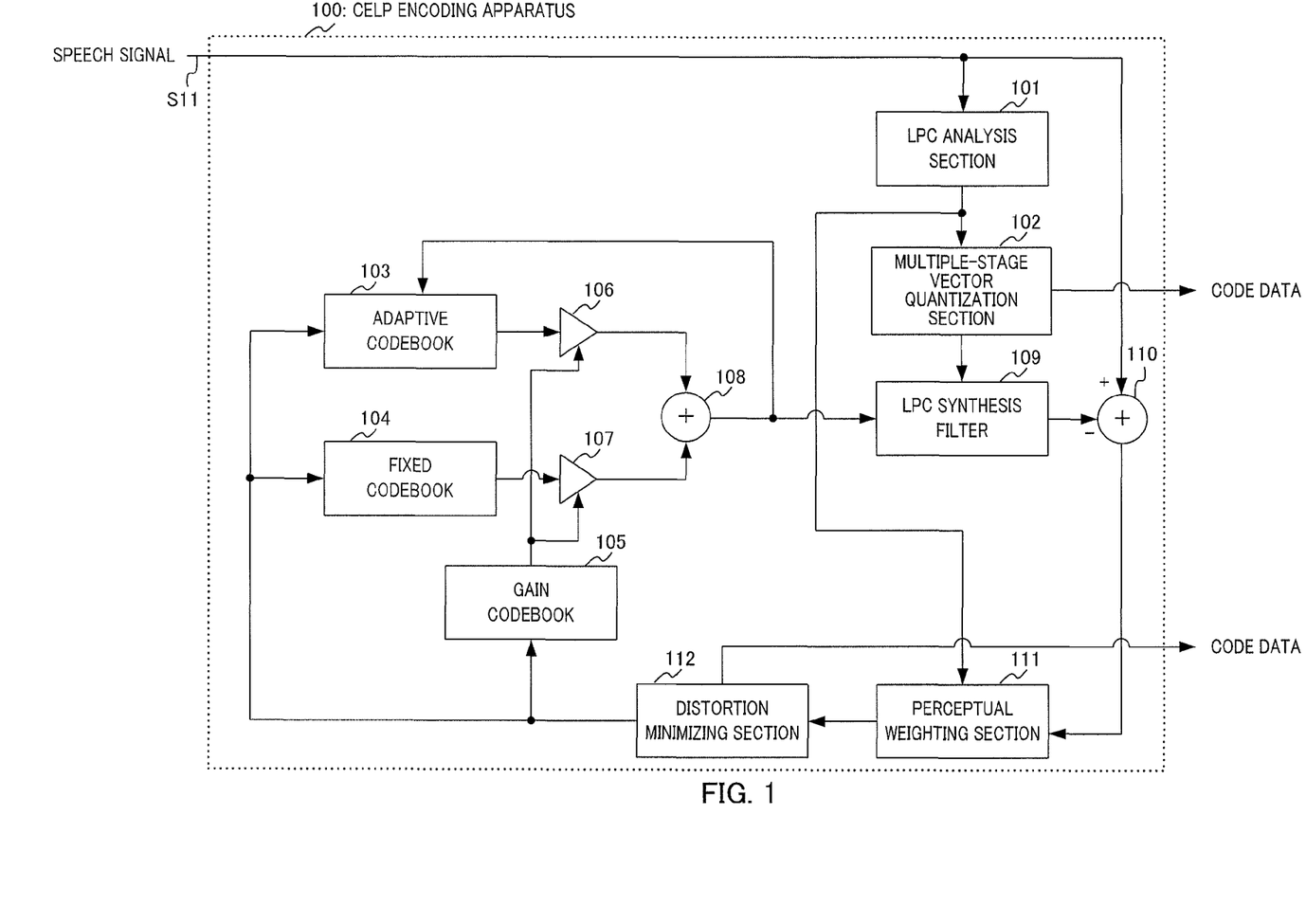
FIG. 1 is a block diagram showing a configuration of a CELP encoding apparatus according to Embodiment 1 of the present invention.

FIG. 1 is a block diagram showing a configuration of CELP encoding apparatus 100 according to Embodiment 1 of the present invention. In CELP encoding apparatus 100, the vocal tract information is encoded by obtaining LPC parameters (that is, linear prediction coefficients) among speech signals S11 consisting of vocal tract information and excitation information. Further, in CELP encoding apparatus 100, the excitation information is encoded by obtaining code data that specifies which one of speech models stored beforehand is to be used, that is, by obtaining code data that specifies what kind of excitation vector (that is, code vector) is to be generated in each of adaptive codebook 103 and fixed codebook 104.

Specifically, each section of CELP encoding apparatus 100 performs the following operations.

LPC analysis section 101 applies linear predictive analysis to speech signal S11 to obtain LPC parameters which are spectral envelope information, and outputs the LPC parameters to multiple-stage vector quantization section 102 and perceptual weighting section 111.

Multiple-stage vector quantization section 102 performs multiple-stage vector quantization of the LPC parameters obtained by LPC analysis section 101 and outputs the obtained quantized LPC parameters to LPC synthesis filter 109 and outputs the code data of the quantized LPC parameters to the outside of CELP encoding apparatus 100.

On the other hand, adaptive codebook 103 stores the past excitations used by LPC synthesis filter 109, and generates an excitation vector for one sub-frame from the stored excitations according to an adaptive codebook lag corresponding to the code data specified by distortion minimizing section 112. The generated excitation vector is outputted as an adaptive codebook vector to multiplier 106.

Fixed codebook 104 stores beforehand a plurality of excitation vectors having predetermined shapes, and outputs, as a fixed codebook vector, an excitation vector corresponding to the code data specified by distortion minimizing section 112 to multiplier 107. As described below, fixed codebook 104 is an algebraic codebook, and weighting is made by addition in a configuration using an algebraic codebook based on two kinds of pulses.

An algebraic excitation is an excitation which is adopted in a number of standard codecs, and which is formed by arranging a small number of impulses having information only on the position and polarity (that is, + or −), and having the magnitude of 1. The algebraic excitation is described, for example, in chapter 5.3.1.9 of section 5.3 "CS-ACELP" and chapter 5.4.3.7 of section 5.4 "ACELP" in the ARIB standard "RCR STD-27K".

Note that adaptive codebook 103 described above is used for representing a component having strong periodicity such as voiced speech. On the other hand, fixed codebook 104 is used for representing a component having weak periodicity such as white noise.

According to an instruction from distortion minimizing section 112, gain codebook 105 generates a gain (adaptive codebook gain) for an adaptive codebook vector outputted from adaptive codebook 103, and a gain (fixed codebook gain) for a fixed codebook vector outputted from fixed codebook 104 and outputs the generated gains to multipliers 106 and 107, respectively.

Multiplier 106 multiplies the adaptive codebook vector outputted from adaptive codebook 103 by the adaptive codebook gain outputted from gain codebook 105, and outputs the result to adder 108.

Multiplier 107 multiplies the fixed codebook vector outputted from fixed codebook 104 by the fixed codebook gain outputted from gain codebook 105, and outputs the result to adder 108.

Adder 108 adds the adaptive codebook vector outputted from multiplier 106, and the fixed codebook vector outputted from multiplier 107 to form an excitation vector, and outputs, as an excitation, the excitation vector to LPC synthesis filter 109.

LPC synthesis filter 109 generates a synthesized signal by using a filter function in which the quantized LPC parameters outputted from multiple-stage vector quantization section 102 are used as filter coefficients, and in which the excitation vector generated by adaptive codebook 103 and fixed codebook 104 is used as an excitation, that is, generates a synthesized signal by using an LPC synthesis filter. LPC synthesis filter 109 outputs the generated synthesized signal to adder 110.

Adder 110 calculates an error signal by subtracting the synthesized signal generated by LPC synthesis filter 109 from speech signal S11, and outputs the error signal to perceptual weighting section 111. The error signal corresponds to encoding distortion.

Perceptual weighting section 111 applies perceptual weighting to the encoding distortion outputted from adder 110, and outputs, to distortion minimizing section 112, the encoding distortion subjected to perceptual weighting.

Distortion minimizing section 112 obtains, for each sub-frame, each of indexes of adaptive codebook 103, fixed codebook 104, and gain codebook 105, which indexes minimize the encoding distortion outputted from perceptual weighting section 111, and outputs these indexes to the outside of CELP encoding apparatus 100 as code data. More specifically, a series of processing of generating a synthesized signal on the basis of adaptive codebook 103 and fixed codebook 104 described above, and obtaining encoding distortion of the synthesized signal is configured as closed loop control (feedback control), and hence distortion minimizing section 112 performs search in each of the codebooks by variously changing, within one sub-frame, the code data indicated in each of the codebooks, and outputs code data which are eventually obtained for each of the codebooks and minimize the encoding distortion.

The excitation at the time when the encoding distortion is minimized is fed back to adaptive codebook 103 for each sub-frame. Adaptive codebook 103 updates the stored excitation on the basis of the feedback.

Described below is the searching method of fixed codebook 104. First, search of an excitation vector and derivation of code data are performed by searching an excitation vector minimizing the encoding distortion obtained by following equation 1:

[1]

$$E = |x - (pHa + qHs)|^2 \quad \text{(Equation 1)}$$

where E: encoding distortion, x: encoding target, p: gain of adaptive codebook vector, H: perceptual weighting synthesis filter, a: adaptive codebook vector, q: gain of fixed codebook vector, s: fixed codebook vector Generally, the search of each of the adaptive codebook vector and the fixed codebook vector is performed in an open loop (in each separate loop), and hence the code of fixed codebook 104 is derived by searching a fixed codebook vector which minimizes the encoding distortion expressed by following equation 2:

[2]

$$y = x - pHa$$

$$E = |y - qHs|^2 \quad \text{(Equation 2)}$$

where E: encoding distortion, x: encoding target (perceptual weighting speech signal), p: optimum gain of adaptive codebook vector, H: perceptual weighting synthesis filter, a: adaptive codebook vector, q: gain of fixed codebook vector, s: fixed codebook vector, y: target vector for search of fixed codebook Accordingly, gains p and q are determined after the search of the code of the excitation, and hence it is assumed here that the search is performed with optimum gains. As a result, equation 2 can be written as the following equation 3:

(Equation 3)

$$y = x - \frac{x \cdot Ha}{|Ha|^2} \quad [3]$$

$$E = \left| y - \frac{y \cdot Hs}{|Hs|^2} Hs \right|^2$$

It can be seen that minimizing the distortion expressed by equation 3 is equivalent to maximizing function C expressed by the following equation 4:

(Equation 4)

$$C = \frac{(yH \cdot s)^2}{sHHs} \quad [4]$$

Therefore, in the case of searching an excitation, such as an excitation of the algebraic codebook that is composed of a small number of pulses, when yH and HH are calculated beforehand, function C is thereby calculated with a small amount of calculation.

Figure 2:
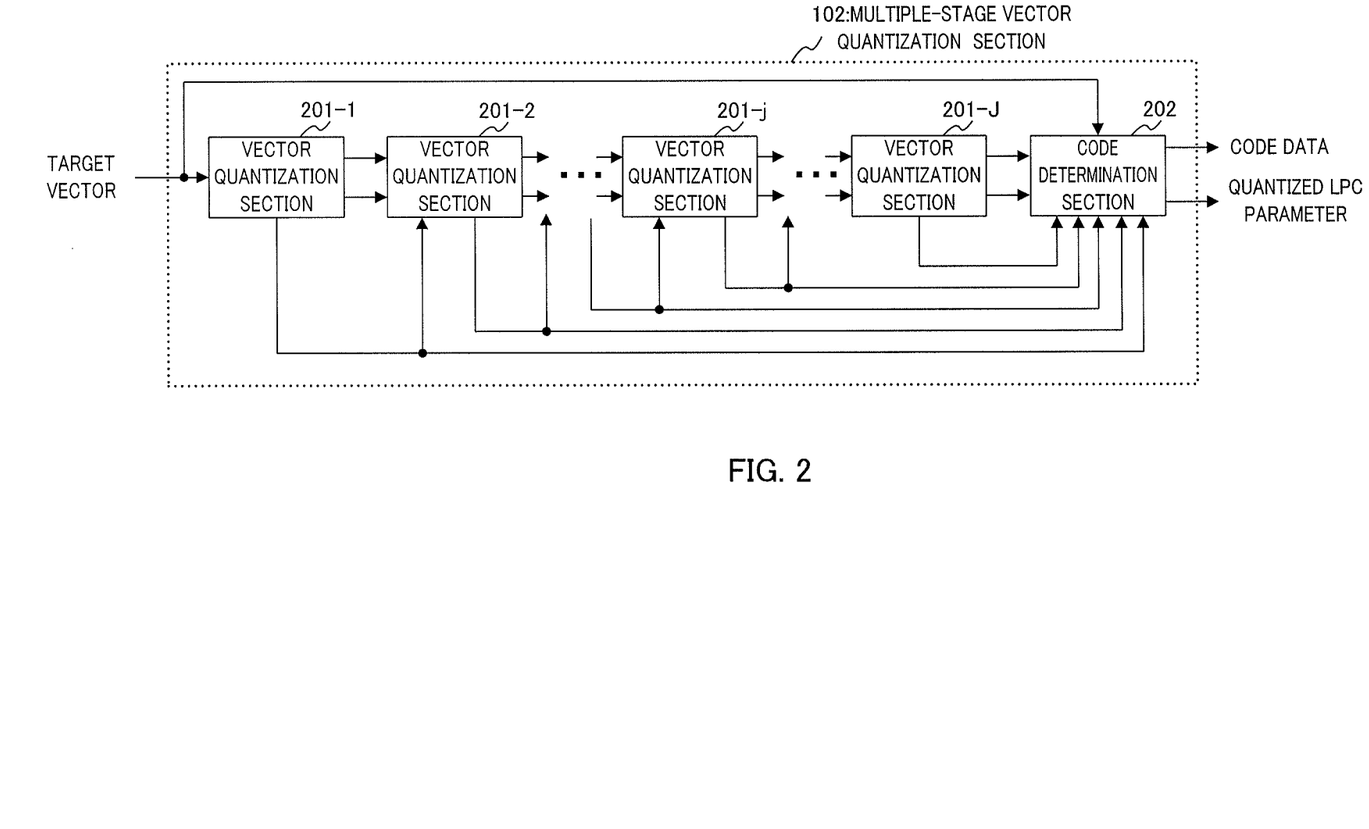
FIG. 2 is a block diagram showing an internal configuration of the multiple-stage vector quantization section shown in FIG. 1.

FIG. 2 is a block diagram showing an internal configuration of multiple-stage vector quantization section 102 shown in FIG. 1. In the present embodiment, a multiple-stage vector quantization (multiple-stage VQ) method is used as a quantization method of spectrum parameters (LPC parameters). The multiple-stage VQ method is a method in which VQ is continuously performed in multiple stages and in which quantization distortion in the preceding stage is quantized in the subsequent stage. Here, the internal configuration of multiple-stage vector quantization section 102 will be described on the assumption that the number of quantization bits is relatively large and that the number of stages of VQ is also relatively large, such as six to ten or more.

Vector quantization section 201-1 quantizes the LPC parameters obtained by LPC analysis section 101, that quantizes an encoding target (target vector). Specifically, vector quantization section 201-1 performs vector quantization processing in which distances (quantization distortion) between the target vector and the code vectors stored in the codebook are calculated to obtain the number of the code vector corresponding to the smallest distance. In tree search, the numbers of several candidates are obtained in order from the candidate having the smallest distance (quantization distortion). Vector quantization section 201-1 obtains a temporary target vector as quantization distortion, code candidates (number sequence (candidate number sequence) in tree search), and the number of candidates and outputs the obtained temporary target vector, code candidates, and number of candidates to vector quantization section 201-2 and also outputs the obtained code candidates to code determination section 202.

Vector quantization section 201-2 performs the same quantization processing as vector quantization section 201-1 on the temporary target vector (a plurality of temporary target vectors in tree search in some cases) outputted from vector quantization section 201-1 and output temporary target vectors code candidates (candidate number sequences), and the number of candidates to vector quantization section 201-3 and also outputs the code candidates to code determination section 202.

Each of vector quantization sections 201-3 to 201-J performs the same quantization processing as vector quantization section 201-1, and vector quantization section 203-J outputs, to code determination section 202, a temporary target vector, a code candidate (candidate number sequence), and the number of candidates.

Code determination section 202 integrates, into one data sequence, the code numbers of the candidate number sequence having the smallest quantization distortion among the candidate number sequence outputted from each of vector quantization sections 201-1 to 201-J, and outputs the integrated data sequence to the outside of CELP encoding apparatus 100. Further, the value obtained by subtracting the final distortion from the target vector which is the input of multiple-stage vector quantization section 102 corresponds to a decoded vector which is a result of decoding using the code data. Also, code determination section 202 obtains, from this decoded vector, quantized LPC parameters to be used by LPC synthesis filter 109, and outputs the quantized LPC parameters to LPC synthesis filter 109.

Figure 3:
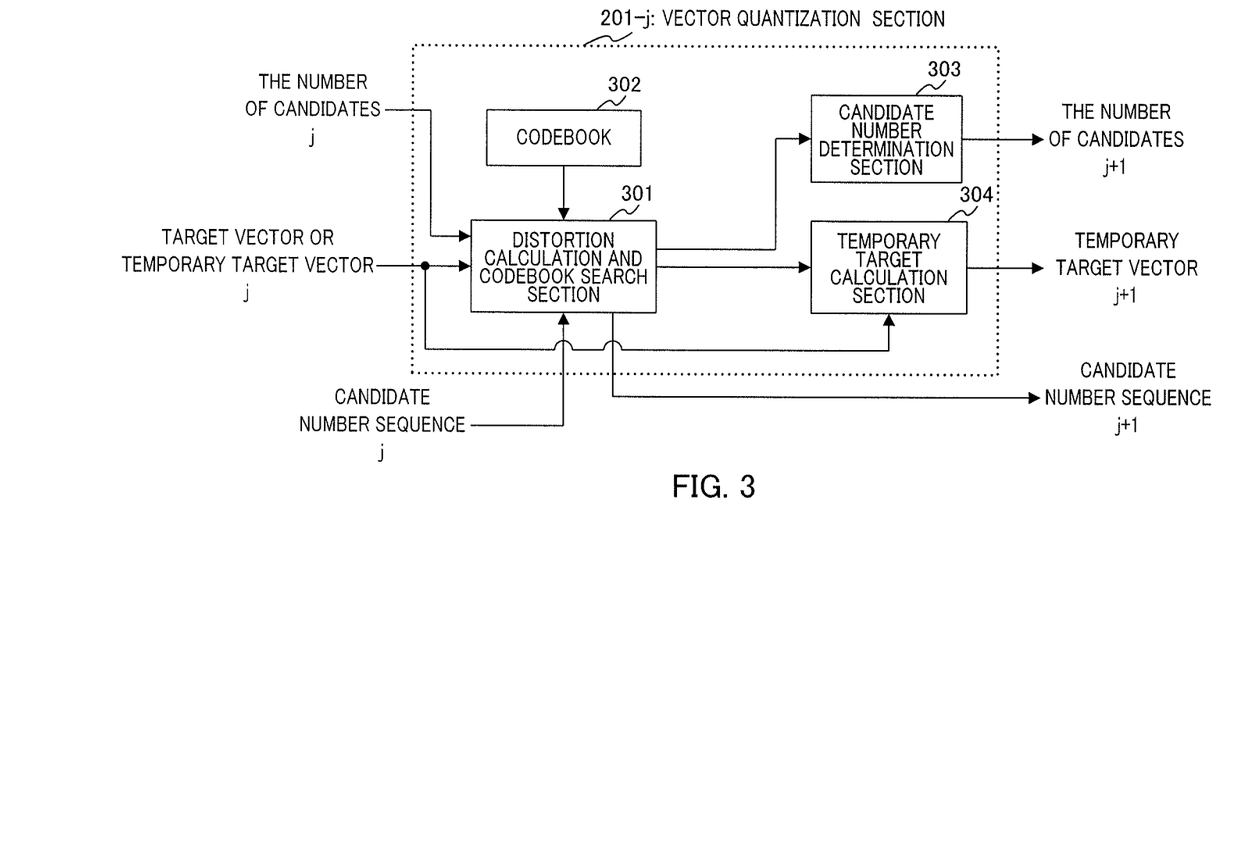
FIG. 3 is a block diagram showing an internal configuration of the vector quantization section shown in FIG. 2.

FIG. 3 is a block diagram showing an internal configuration of vector quantization section 201-$j$ ($1 \leq j \leq J$) shown in FIG. 2. In the following, the internal configuration of vector quantization section 201-$j$ ($1 \leq j \leq J$) will be described with reference to FIG. 3.

Three signals are inputted into vector quantization section 201-$j$. One of the signals represents the number of candidates j that is the number of candidate number sequences and the numbers of temporary target vectors, which are left as candidates in vector quantization section 201-$j$ and outputted to vector quantization section 201-($j$+1) of the subsequent stage. The next signal represents a target vector or a temporary target vector (hereinafter may be collectively referred to as "temporary target vector") j, which is the initial coding target (target vector) or a temporary target vector obtained, as an encoding distortion vector, in the middle of the stages, that is, in preceding vector quantization section 201-($j$−1). The last signal represents the candidate number sequence j, which is a sequence of the numbers of candidates having the smallest distortion and obtained in each of the vector quantization sections up to the stage of vector quantization section 201-$j$. Note that the number of the target vector is one, but the number of temporary target vectors j and the number of candidate number sequences j may be two or more in some cases.

Accordingly, the number of candidates j is set to K, and the number of candidate j−1 is set to M. Note that the number of target vectors is one in vector quantization section 201-1, and hence M=1. Further, in vector quantization section 201-J of the last stage, only one candidate number sequence needs to be obtained, and hence the value of K may be set as K=1. Note that M means the number of target vectors and candidate number sequences j which are inputted, and K means the number of candidates outputted to vector quantization section 201-($j$+1) of the subsequent stage.

Distortion calculation and codebook search section 301 matches each of M temporary target vectors with each of code vectors stored in codebook 302 (generally performs calculation of Euclidean distance (the sum of square of the difference between each element of each of the temporary target vectors and each element of each of the code vectors)), and searches K candidates in order from the candidate having the minimum distance (quantization distortion) to obtain the code numbers of the candidates. At this time, the number sequence used as the base of the search is also determined. Then, by referring to candidate number sequence j, distortion calculation and codebook search section 301 calculates K candidate number sequences j+1 by respectively connecting the code numbers of the searched candidates to candidate number sequences j, and outputs candidate number sequences j+1 to vector quantization section 201-($j$+1) of the subsequent stage. Further, distortion calculation and codebook search section 301 outputs, to temporary target calculation section 304, the number of candidates j, the code vectors of the code numbers of candidates, the target vector to be quantized. Further, distortion calculation and codebook search section 301 outputs the number of candidates j and one of the values of encoding distortion to candidate number determination section 303.

Note that when vector quantization section 201-$j$ is vector quantization section 201-1 of the first stage, the number of candidates j and candidate number sequence j are set beforehand in vector quantization section 201-1, and hence only a target vector is inputted. Further, when vector quantization section 201-$j$ is vector quantization section 201-J of the last stage, the number of candidates is one and hence only a candidate number sequence obtained by connecting the number providing the smallest distance (quantization distortion) to the candidate number sequence corresponding to the target vector is outputted to code determination section 202 as candidate number sequence j+1. In this stage, candidate number determination section 303 and temporary target calculation section 304 are not operated.

In the following, a specific example of processing of distortion calculation and codebook search section 301 will be described. It is assumed that j=4, M=4 and K=3, and that the vector length is L, and targets (here temporary target vectors) are $x_i^0$, $x_i^1$, $x_i^2$ and $x_i^3$. Since j=4, it is assumed that the number of preceding stages of the vector quantization sections each using a codebook of size 64 (6 bits) is three, and four candidate number sequences are set as follows: (5, 12, 31), (5, 12, 48), (31, 11, 57) and (31, 3, 18). Each of the four candidate sequences is in a one-to-one correspondence relationship with each of the temporary target vectors. The code vector is set as $C_i^m$. The number of the code vector is set as m. Quantization distortion $E_{n,m}$ is expressed by the following equation 5:

(Equation 5)

$$E_{n,m} = \sum_{i=0}^{L} (x_i^n - C_i^m)^2 \qquad [5]$$

Then, the distortion calculation and codebook search section 301 acquires three code numbers in the order from the smallest value of quantization distortion $E_{n,m}$. It is assumed that, as a result of the distortion calculation, three code numbers selected in order of smaller quantization distortion are as follows: (1) code number 35 for temporary target vector 0, (2) code number 8 for temporary target vector 0, and (3) code number 52 for temporary target vector 3. Finally, by referring to the above-described candidate number sequences, the distortion calculation and codebook search section 301 respectively adds the selected code numbers to the last of the candidate number sequences to obtain three candidate number sequences of (5, 12, 31, 35), (5, 12, 31, 8), and (31, 3, 18, 52)

which are output, as candidate number sequences j+1, to the subsequent stage. Further, the distortion calculation and codebook search section 301 outputs three sets of the temporary target vector and the code vector, that is, three sets of ($x_i^0$, $C_i^{35}$), ($x_i^0$, $C_i^8$) and ($x_i^3$, $C_i^{52}$), to temporary target calculation section 304. Further, distortion calculation and codebook search section 301 outputs, to candidate number determination section 303, the number of candidates 3 and one distance (quantization distortion) among the distances respectively obtained for the selected three code numbers. Note that any of the three distances may be outputted in the present embodiment. This is because there is not a large difference in performance even when any of the three distances is outputted.

By referring to the number of candidates j and the distance (quantization distortion) which are outputted from distortion calculation and codebook search section 301, candidate number determination section 303 determines the number of candidates j+1 to be used in vector quantization section 201-(j+1) of the subsequent stage, and outputs the number of candidates j+1 to vector quantization section 201-(j+1).

Temporary target calculation section 304 calculates K temporary target vectors j+1 by subtracting the code vector from the target vector with reference to the sets of the target and code vectors outputted from distortion calculation and codebook search section 301. In the above-described specific example, three vectors of ($x_i^0$-$C_i^{35}$), ($x_i^0$-$C_i^8$) and ($x_i^3$-$C_i^{52}$) are set as temporary target vectors j+1.

Next, candidate number determination section 303 will be described in detail together with the effect of algorithm. In the N-best search used in the tree search VQ method described above, the amount of calculation is increased to N times in proportion to the number of candidates N, when the number of stages is large. On the contrary, the quantization performance is degraded when N is small. The inventor of this application has conducted an analysis of the performance of tree search by repeating a simulation experiment of the multiple-stage VQ method using tree search and found the following four tendencies.

That is, (1) even when the number of candidates N in the N-best search is fixed or increased in each stage, the quantization performance is not so improved as compared with the increase in the amount of calculation. The quantization performance is most effectively improved when a plurality of candidates are left in the first stage in the multiple-stage quantization. (2) If the number of candidates for a search is abruptly reduced at the time when the process shifts to the subsequent stage, the quantization performance is significantly degraded. (3) There is a very large difference in the quantization performance between the case of N=2 and the case of N=1, and when the number of quantization stages is large, almost sufficient quantization performance can be obtained in the case of N=2. (4) When encoding distortion is not reduced after quantization is performed in a plurality of stages, the possibility of an increase in the final outlier (the rate of quantization errors larger than a certain value) is increased.

In consideration of the tendencies mentioned above the inventor of this application has invented, a tree search method that combines the following three algorithms. Accordingly, a tree search method is based on the following procedures. (Procedure 1) Only a pre-specified number of candidates N are left in the first stage, and the process proceeds to the subsequent stage. (Procedure 2) From the second stage, each time the process proceeds to the subsequent stage, the number of candidates is reduced by one so that the number of candidates N is successively set to N−1, N−2, and so on. (Procedure 3) Each time the number of candidates becomes a preset value P or smaller, quantization distortion is evaluated. When the value of quantization distortion is larger than a predetermined threshold value, the number of candidates of the subsequent stage is set to P. When the value of quantization distortion is the predetermined threshold value or smaller, the number of candidates of the subsequent stage is set to a value Q which is smaller than the value P. In the following description, it is assumed, as examples of P and Q, that P=3 and Q=2. Note that, when there is a margin in the amount of calculation, larger values may be set as these values. In this case, encoding distortion can be more reduced.

These algorithms are applied to candidate number determination section 303. As a result, suitable candidates can be selected in the initial stages in such a manner (that is, by (procedure 2)) that a number of candidates are set at first, and that the number of candidates is reduced each time the process proceeds to the subsequent stage. Further, it is possible to obtain a minimum number of candidates as early as possible without degradation of quantization performance, and also it is possible to obtain sufficient quantization performance with a small amount of calculation. Further, with a minimum amount of calculation, encoding distortion can be reduced to a sufficiently small level by controlling the quantization process in such a manner (that is, by (procedure 3)) that each time the candidate number is three (that is, P) or less, the quantization distortion is evaluated, and then, when the quantization distortion is large, the number of candidates is increased to three (that is, P), and when the quantization distortion is sufficiently small, the number of candidates is reduced to two (that is, Q). Thereby, sufficient quantization performance can be obtained with a small amount of calculation.

Figure 4:
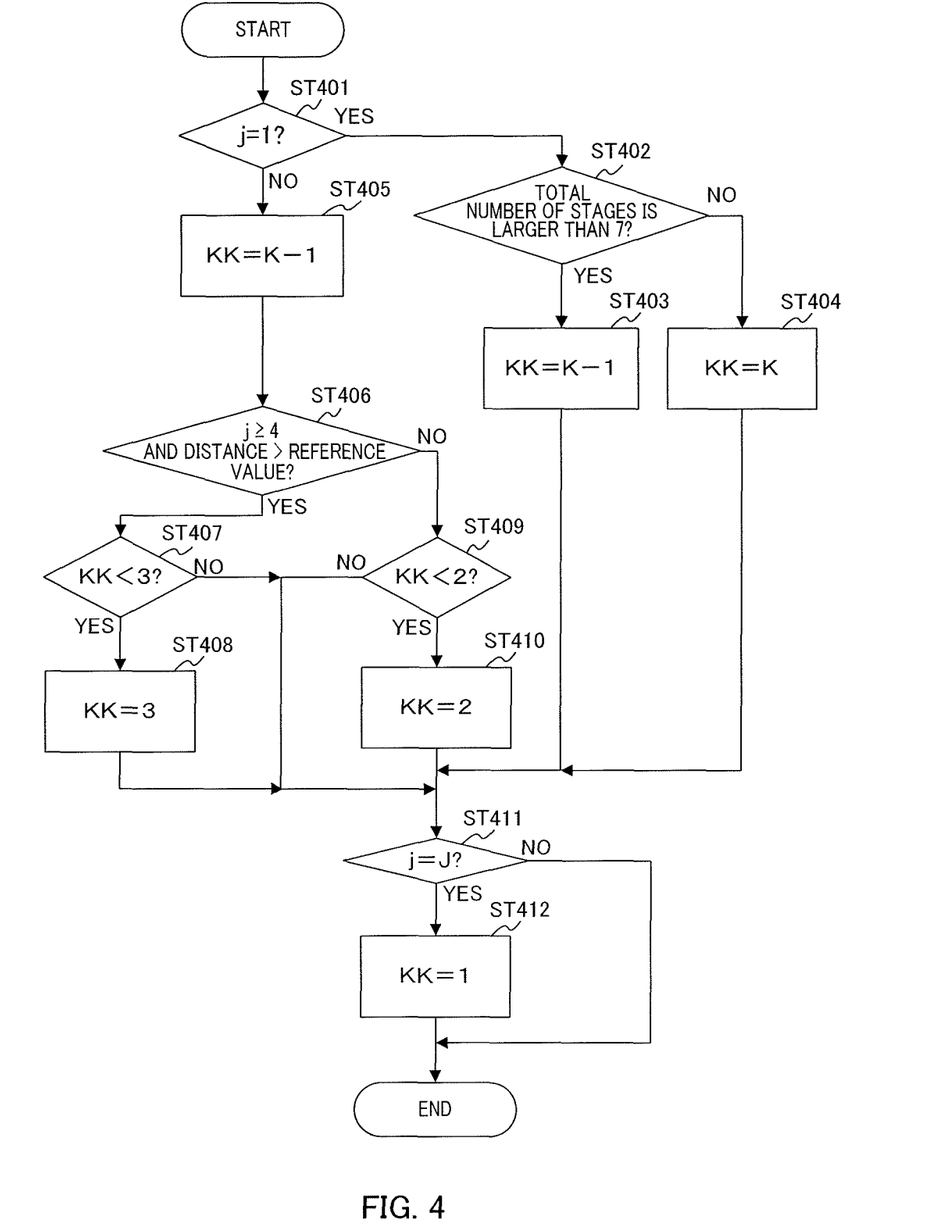
FIG. 4 is a flow chart showing a procedure for determining the number of candidates in the candidate number determination section shown in FIG. 3.

Next, the candidate number determination procedure performed in candidate number determination section 303 will be described with reference to FIG. 4. In the following description, the number of candidates j+1 is represented as KK. The number of candidates j (K) and the distance (quantization distortion), which are obtained from distortion calculation and codebook search section 301, are inputted into candidate number determination section 303. It is assumed that stage number J is held in candidate number determination section 303. Further, it is assumed that the initial value of K and the reference value of the distance are set in advance before the quantization is started. Note that, in FIG. 4, the reference value of the distance is set to, for example, 50000, but there may be a case where the other value is suitable as the reference value of the distance. A suitable value may be set as the reference value of the distance, according to the vector dimension, the vector element values, or the like.

First, in step (hereinafter abbreviated as "ST") 401, it is determined whether or not the stage number is set as j=1, that is, the quantization stage is set to vector quantization section 201-1. When the stage number is set as j=1 (YES), the process shifts to ST402, and when the stage number is not set as j=1 (NO), the process shifts to ST405.

In ST402, the number of candidates K (in this case, the initial value of K) is used as input, and it is determined whether or not the total number of stages is larger than seven. When the total number of stages is larger than seven, the process shifts to ST403, and when the total number of stages is not larger than seven, the process shifts to ST404. Naturally, there may be a case where a numerical value other than "seven" is suitable depending on conditions. A suitable value may be set according to the total number of stages, the initial value of the number of candidates, or the like.

In ST403, KK is set as KK=K−1. In ST404, KK is set as KK=K.

In ST405, it is determined that the stage number j is not set as j=1 (the quantization stage is not vector quantization section 201-1), and hence KK is set as KK=K−1. In ST406, it is determined whether or not the stage number j is set as j=4 or more, and whether or not the distance (quantization distortion) exceeds the reference value. When these conditions are satisfied (YES), the process shifts to ST407, and when these conditions are not satisfied (NO), the process shifts to ST409. Note that here, the value of j is set as j=4 or more, but there may also be a case where a value other than this value is suitable.

In ST407, it is determined whether or not the value of KK is smaller than three (=P). When the value of KK is smaller than three (=P) (YES), the process shifts to ST408 to set KK as KK=3, and when the value of KK is not smaller than three (=P) (NO), the process shifts to ST411.

Further, in ST409, it is determined whether or not the value of KK is smaller than two (=Q). When the value of KK is smaller than two (=Q) (YES), the process shifts to ST410 to set the value of KK as KK=2, and when the value of KK is not smaller than two (=Q) (NO), the process shifts to ST411.

As described above, the procedure in ST406 to ST410 is configured to enable the effect reducing the overall quantization distortion to be obtained in such a manner that, after quantization is performed in a certain number of stages, when the distance (quantization distortion) is sufficiently small, the number of candidates is set to a small value, and when the distance is still large, the number of candidates is set to a larger value. The procedure in ST406 to ST410 is based on the algorithm in which, while the minimum number of candidates of "2" (=Q) is secured, the overall quantization distortion is more reduced by using the number of candidates of "3" (=P). In the quantization experiment carried out by the inventor of this application, it was confirmed that the outlier (that is, the rate at which the value of quantization distortion becomes larger than a certain large value) can be reduced by such a distance determination procedure.

In ST411, it is determined whether or not the stage number j is set as j=J, that is, the quantization stage is the final stage. When the stage number j is set as j=J (YES), the process shifts to ST412, and when the step number j is not set as j=J (NO), the processing of determining the number of candidates in this stage is ended.

In ST412, the value of KK is set as KK=1, and the processing of determining the number of candidates in the final stage is ended.

To show the effectiveness of the present invention, a quantization experiment, in which the present invention was applied to ISF quantization in CELP, is shown. An encoder, which is based on CELP, has a bit rate of about 24 k bps, and data used in the experiment are forty samples of Japanese which have a wide frequency band. A 16-dimension ISF (Immittance Spectral Frequency) vector was quantized. The multiple-stage VQ method used as a base of the experiment is an N-base tree search method and has six or more stages. In the present invention, the initial number of candidates is set to N. The results of the quantization experiment are shown in table 1.

TABLE 1

|  | MAXwMOPS | S/N | S/Nseg | SD | Outlier >2 dB |
| --- | --- | --- | --- | --- | --- |
| Base | 45.389 | 14.51 | 13.00 | 1.1604 | 2.76% |
| Present invention | 43.718 | 14.49 | 13.00 | 1.1706 | 2.97% |

From table 1, it can be seen that the amount of calculation of the maximum frame can be reduced by about 1.7 wMOPS (weitghed Mega Oparation Per Second), and the amount of calculation can be significantly reduced. Further, it can be seen that the S/N ratio (Signal/Noise ratio) is hardly changed, and synthesis speech is hardly degraded in terms of its objective value. Even when the distortion of the ISF vector is compared in terms of SD (Spectral Distance), the amount of degradation is as small as 0.01 dB. When a rate of quantization errors of 2 dB or more is recognized as an outlier, the degradation is only 0.2%. This corresponds to a rate of one time per 500 frames, and hence shows that there is almost no degradation. Further, the processing added according to the present invention is only the processing for determining the number of candidates, and the amount of calculation required for the processing is small. Therefore, the influence of the processing on the whole algorithm is also small.

As described above, in Embodiment 1, the multiple-stage VQ method using tree search is performed in such a manner that the number of candidates is set to a predetermined value of N in the first stage, that in the second stage and the stages subsequent to the second stage, the number of candidates is reduced by one each time the process proceeds to the subsequent stage. During this processing, each time the number of candidates becomes three or less, quantization distortion is evaluated. When the amount of evaluated quantization distortion is larger than a predetermined threshold value, the number of candidates of the subsequent stage is set to 3 (=P), and when the amount of evaluated quantization distortion is the predetermined threshold value or less, the number of candidates of the subsequent stage is set to 2 (=Q). Thereby, a suitable candidate can be selected in the initial stages, and a minimum number of candidates can be selected as quickly as possible without degrading the quantization performance. Further, sufficient quantization performance can be obtained with a small amount of calculation. Further, the process can be controlled so that the encoding distortion is reduced to a sufficiently small level with a minimum amount of calculation.

Embodiment 2

A configuration of a CELP encoding apparatus according to Embodiment 2 of the present invention is the same as the configuration of Embodiment 1 shown in FIG. 1 except for that the functions of candidate number determination section 303 of vector quantization section 201-*j* are different, and hence the functions are described by using FIG. 1 to FIG. 3 as required.

Figure 5:
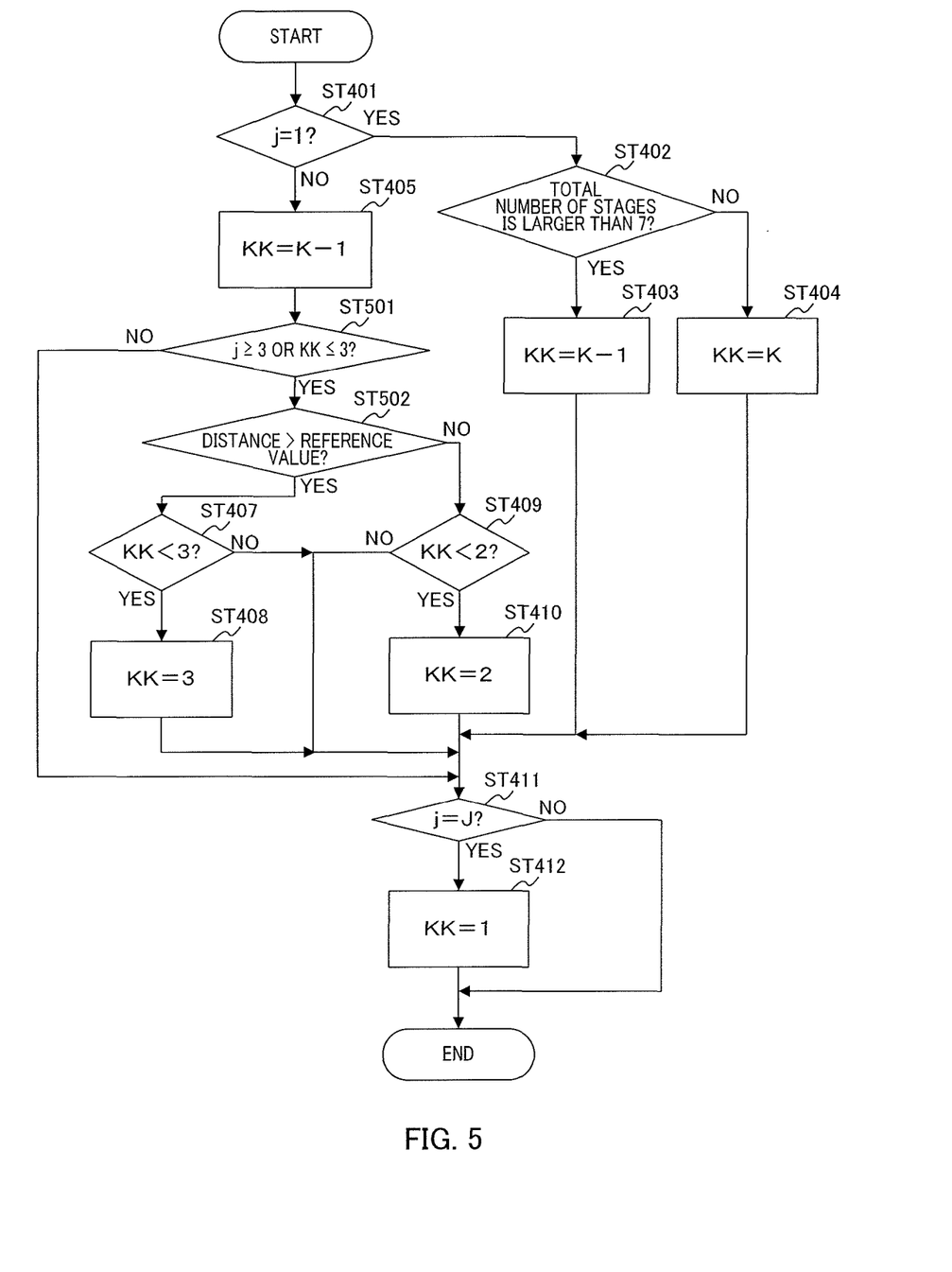
FIG. 5 is a flow chart showing a procedure for determining the number of candidates in a candidate number determination section according to Embodiment 2 of the present invention.

FIG. 5 is a flow chart showing a procedure for determining the number of candidates in candidate number determination section 303 according to Embodiment 2 of the present invention. In the following, the procedure for determining the number of candidates will be described with reference to FIG. 5. However, in FIG. 5, portions which are common to those in FIG. 4 are denoted by the same reference numerals, and the duplicated explanation is omitted.

Further, in the following description, the conditions are assumed to be the same as the conditions in FIG. 4 of Embodiment 1. That is, the number of candidates j+1 is represented as KK. The number of candidates j (K) and the distance (quantization distortion), which are obtained from distortion calculation and codebook search section 301, are inputted into candidate number determination section 303. Further, it is assumed that stage number J is held in candidate number determination section 303. It is also assumed that the initial value of K and the reference value of distance are set in advance before the quantization is started. Note that, in FIG. 5, the reference value of distance is set to, for example, 50000, but there may be a case where the other value is suitable as the reference value of distance. A suitable value may be set as the reference value of distance according to the vector dimension, the vector element values, or the like.

In ST501, it is determined whether or not the stage number j is set as j=3 or more, or whether or not the value of KK is set as KK=3 or less. When the condition is satisfied (YES), the process shifts to ST502, and when the condition is not satisfied (NO), the process shifts to ST411.

In ST502, it is determined whether or not the distance (quantization distortion) exceeds the reference value. When the distance exceeds the reference value (YES), the process shifts to ST407, and when the distance does not exceed the reference value (NO), the process shifts to ST409.

As described above, with Embodiment 2, it is checked, before evaluating the quantization distortion, that the number of candidates KK is sufficiently reduced. Thereby, when the number of candidates KK is sufficiently reduced, the number of candidates can be readily controlled by using the quantization distortion, and hence sufficient quantization performance can be obtained with as small amount of calculation as possible.

Note that in each of Embodiment 1 and Embodiment 2 described above, as shown in FIG. 3, candidate number determination section 303 is provided at the subsequent stage of distortion calculation and codebook search section 301, but candidate number determination section 303 may be provided at the preceding stage of distortion calculation and codebook search section 301. In this case, it is obvious that candidate number determination section 303 can use the distance (quantization distortion) and the number of candidates from the vector quantization section provided in the preceding stage, and the same effects can be obtained.

Further, in each of Embodiment 1 and Embodiment 2 described above, an example in the case of CELP is shown. However, the present invention is an invention which can be used for vector quantization, and hence it is obvious that the present invention is not limited to the case of CELP. For example, the present invention can be applied to spectrum quantization using MDCT (Modified Discrete Cosine Transform) or QMF (Quadrature Mirror Filter), and can also be applied to an algorithm which searches similar spectral shapes from spectra of a low frequency region in a band expanding technique. Further, the present invention can be applied to all coding methods using LPC analysis.

Further, in each of Embodiment 1 and Embodiment 2 described above, an example of quantizing an ISF parameter is shown, but the present invention is not limited to this. The present invention can be applied to the case of quantizing parameters, such as parameters of ISP (Immittance Spectrum Pairs), LSP (Lin Spectrum Pairs), and PARCOR (PARtial autoCORrelation). This is because it is only necessary to use another quantization method instead of the ISF quantization used in each of Embodiment 1 and Embodiment 2.

Further, in each of Embodiment 1 and Embodiment 2 described above, the present invention is applied to tree-search VQ of CELP spectrum parameters, but it is obvious that the present invention is also effective in quantization of another parameter vector. This is because the features of the parameters do not affect the present invention.

Further, in each of Embodiment 1 and Embodiment 2 described above, Euclidean distance is used for distortion calculation and codebook search section 301, but the other distance scale, such as weighted Euclidean distance or city-block distance (sum of absolute values), may be used. This is because the present invention is featured in the algorithm of candidate number determination section 303, and the distance scale is unrelated to the present invention.

Further, in each of Embodiment 1 and Embodiment 2 described above, the case where the present invention is applied to an encoder is shown, but the present invention can also be applied to tree search used for pattern matching, such as speech recognition or image recognition. This is because the present invention relates to determination of the number of candidates in tree search and is not affected by the purpose of the whole algorithm.

Further, the encoding apparatus described in each of Embodiment 1 and Embodiment 2 described above can be used by being mounted to a communication terminal apparatus or a base station apparatus.

Further, in each of Embodiment 1 and Embodiment 2 described above, the reference value to be compared with distance (quantization distortion) is set to a predetermined constant, but it is obvious that the reference value may be set to a different value for each stage (stage number). This is because the present invention does not limit the reference value. When the reference value is changed for each stage (stage number), it is possible to realize more efficient search.

Further, in each of Embodiment 1 and Embodiment 2 described above, predetermined numerical values of "3 and 2" are used for control of the number of candidates, but numerical values, such as "4 and 3", "4 and 2", may also be used as the numerical values used for control of the number of candidates. Further, the numerical values may also vary for each stage (stage number). These numerical values may be set according to cases such as where there is a margin in the amount of calculation, or where higher performance is required.

Further, in Embodiment 2, the predetermined numerical values (constants) of "3 and 3" are respectively used for determination of j and KK, but these values may be changed to numerical values of "2 and 2", "2 and 3", "4 and 3", "2 and 4", "4 and 4", "5 and 4", or the like. These numerical values may also vary for each stage (stage number). These numerical values may be set according to cases such as where there is a margin in the amount of calculation, or where higher performance is required.

Further, each of Embodiment 1 and Embodiment 2 described above has been described by taking, as an example, the case where the present invention is configured by hardware, but the present invention can also be realized by software associated with hardware.

Each function block used for describing each of Embodiment 1 and Embodiment 2 is typically realized as an LSI which is an integrated circuit. Each of these function blocks may be individually realized by one chip, but a part of or all of these function blocks may also be realized by one chip. Here, the integrated circuit is referred to as LSI, but according to the difference in integration degree, the integrated circuit may also be referred to as an IC, a system LSI, a super LSI, and an ultra LSI.

Further, the circuit integration method is not limited to LSI, and the function blocks may be realized by a dedicated circuit or a general-purpose processor. The function blocks may also be realized by using an FPGA (Field Programmable Gate Array) which can be programmed after the LSI is manufactured, or by using a reconfigurable processor in which the connection or the setting of circuit cells in the LSI can be reconfigured after the LSI is manufactured.

Further, if a circuit integration technique, which could be used in place of LSI, is emerged with the progress of semiconductor technique or realized by another technique resulting from such a progress, the function blocks may of course be integrated by using the technique. Application of biotechnology, and the like, is conceivable.

The disclosure of Japanese Patent Application No. 2010-210116 filed on Sep. 17, 2010, and Japanese Patent Application No. 2010-230537 filed on Oct. 13, 2010, including the specification, drawings and abstract, is incorporated herein by reference in its entirety.

INDUSTRIAL APPLICABILITY

The quantization apparatus and the quantization method according to the present invention are applicable to a speech encoding apparatus, and the like.

REFERENCE SIGNS LIST

101 LPC analysis section
102 Multiple-stage vector quantization section
103 Adaptive codebook
104 Fixed codebook
105 Gain codebook
106, 107 Multiplier
108, 110 Adder
109 LPC synthesis filter
111 Perceptual weighting section
112 Distortion minimizing section
201-1 to 201-J Vector quantization section
202 Code determination section
301 Distortion calculation and codebook search section
302 Codebook
303 Candidate number determination section
304 Temporary target calculation section

The invention claimed is:

1. A quantization apparatus that performs multiple-stage quantization by using tree search, comprising:
a searcher that matches each of one or more of encoding targets with a code vector stored in a codebook to select a certain number of candidates including one in order of smaller quantization distortion, the number of candidates being determined in a preceding stage or determined beforehand;
a calculator that calculates a quantization error vector by subtracting the code vector from the target for each of the candidates; and
a candidate number determiner that determines a certain number of candidates to be used in a subsequent stage, on the basis of the number of candidates determined in the preceding stage,
wherein, in the case where the number of candidates determined in the preceding stage is not greater than a value P specified beforehand, the candidate number determiner determines that, when a value of the quantization distortion is larger than a predetermined threshold value, the value P is used as the number of candidates in the subsequent stage, and determines that, when the value of the quantization distortion is not greater than the predetermined threshold value, a value Q smaller than the value P specified beforehand is used as the number of candidates in the subsequent stage.

2. A quantization apparatus that performs multiple-stage quantization by using tree search, comprising:
a searcher that matches each of one or more of encoding targets with a code vector stored in a codebook to select a certain number of candidates including one in order of smaller quantization distortion, the number of candidates being determined in a preceding stage or determined beforehand;
a calculator that calculates a quantization error vector by subtracting the code vector from the target for each of the candidates; and
a candidate number determiner that determines a certain number of candidates to be used in a subsequent stage, on the basis of the number of candidates determined in the preceding stage,
wherein, in the case where a present number of stages is at least a predetermined number of stages, or the number of candidates is not greater than a predetermined number of candidates P, the candidate number determiner determines that a predetermined number of candidates R is used in the subsequent stage, when a value of the quantization distortion is larger than a predetermined threshold value and also the number of candidates is smaller than the predetermined number of candidates R, and
the candidate number determiner determines that a predetermined number of candidates Q is used in the subsequent stage when the value of the quantization distortion is the predetermined threshold value or less and also the number of candidates is smaller than the predetermined number of candidates Q which is smaller than the number of candidates R.

3. A quantization method configured to perform multiple-stage quantization by using tree search, comprising:
matching each of one or more encoding targets with a code vector stored in a codebook to select, in a first stage, a certain number of candidates including one in order of smaller quantization distortion, the number of candidates being determined beforehand, and to select, in a second stage and in a stage subsequent to the second stage, a certain number of candidates in order of smaller quantization distortion, the number of candidates being determined in a preceding stage;
calculating a quantization error vector by subtracting the code vector from the target for each of the candidates; and
determining the number of candidates to be used in the subsequent stage, on the basis of the number of candidates determined in the preceding stage,
wherein, in the case where the number of candidates determined in the preceding stage is not greater than a value P specified beforehand, a candidate number determiner determines that, when a value of the quantization distortion is larger than a predetermined threshold value, the value P is used as the number of candidates in the subsequent stage, and determines that, when the value of the quantization distortion is not greater than the predetermined threshold value, a value Q smaller than the value P specified beforehand is used as the number of candidates in the subsequent stage.

4. A quantization method configured to perform multiple-stage quantization by using tree search, comprising:
matching each of one or more encoding targets with a code vector stored in a codebook to select, in a first stage, a certain number of candidates including one in order of smaller quantization distortion, the number of candidates being determined beforehand, and to select, in a second stage and in a stage subsequent to the second stage, a certain number of candidates in order of smaller quantization distortion, the number of candidates being determined in a preceding stage;

calculating a quantization error vector by subtracting the code vector from the target for each of the candidates; and determining the number of candidates to be used in the subsequent stage, on the basis of the number of candidates determined in the preceding stage, wherein, in the case where a present number of stages is at least a predetermined number of stages, or the number of candidates is not greater than a predetermined number of candidates P, a candidate number determiner determines that a predetermined number of candidates R is used in the subsequent stage, when a value of the quantization distortion is larger than a predetermined threshold value and also the number of candidates is smaller than the predetermined number of candidates R, and the candidate number determiner determines that a predetermined number of candidates Q is used in the subsequent stage when the value of the quantization distortion is the predetermined threshold value or less and also the number of candidates is smaller than the predetermined number of candidates Q which is smaller than the number of candidates R.

* * * * *